United States Patent
Sohn

(10) Patent No.: US 8,018,245 B2
(45) Date of Patent: Sep. 13, 2011

(54) SEMICONDUCTOR DEVICE

(75) Inventor: Kyo-Min Sohn, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/751,698

(22) Filed: Mar. 31, 2010

(65) Prior Publication Data

US 2010/0253384 A1 Oct. 7, 2010

(30) Foreign Application Priority Data

Apr. 1, 2009 (KR) .................... 10-2009-0028200

(51) Int. Cl.
*H03K 19/00* (2006.01)

(52) U.S. Cl. ............. 326/26; 326/27; 326/87; 327/108; 327/170

(58) Field of Classification Search ............... 326/26, 326/27, 30, 83, 87; 327/108, 170, 380
See application file for complete search history.

(56) References Cited

U.S. PATENT DOCUMENTS

| | | | | |
|---|---|---|---|---|
| 5,568,081 | A * | 10/1996 | Lui et al. | 327/380 |
| 5,923,183 | A * | 7/1999 | Kim et al. | 326/27 |
| 5,949,254 | A | 9/1999 | Keeth | |
| 6,288,563 | B1 * | 9/2001 | Muljono et al. | 326/27 |
| 6,538,464 | B2 | 3/2003 | Muljono et al. | |
| 6,583,644 | B2 * | 6/2003 | Shin | 326/26 |
| 6,636,069 | B1 * | 10/2003 | Muljono | 326/30 |
| 7,202,702 | B2 * | 4/2007 | Arnold et al. | 326/87 |
| 7,236,012 | B2 * | 6/2007 | Cho et al. | 326/83 |
| 7,248,088 | B2 * | 7/2007 | Hargan | 327/170 |
| 7,378,878 | B2 * | 5/2008 | Major | 326/87 |
| 7,821,289 | B2 * | 10/2010 | Lee | 326/27 |
| 2008/0106297 | A1 * | 5/2008 | Jao | 326/27 |

FOREIGN PATENT DOCUMENTS

| | | |
|---|---|---|
| KR | 1020000057264 | 9/2000 |
| KR | 1020010027122 | 4/2001 |
| KR | 1020080089072 | 10/2008 |

* cited by examiner

*Primary Examiner* — Vibol Tan
(74) *Attorney, Agent, or Firm* — F. Chau & Associates, LLC

(57) ABSTRACT

A semiconductor device is provided. A pull-up slew rate controller receives a first driving control signal generated in a first mode of operation, a second driving control signal generated in a second mode of operation, and data, and upon a first transition of the data, sequentially activates the data and a first pull-up delayed signal having different delay times in the first mode of operation and sequentially activates the data and the first to third pull-up delayed signals having different delay times in the second mode of operation. A pull-up driving unit sequentially pulls a data output terminal up in response to the data and the first to third pull-up delayed signals. A pull-down slew rate controller, upon a second transition of the data, sequentially activates the data and the first pull-down delayed signal having different delay times in the first mode of operation and sequentially activates the data and the first to third pull-down delayed signals having different delay times in the second mode of operation. A pull-down driving unit sequentially pulls the data output terminal down in response to the data and the first to third pull-down delayed signals.

11 Claims, 7 Drawing Sheets

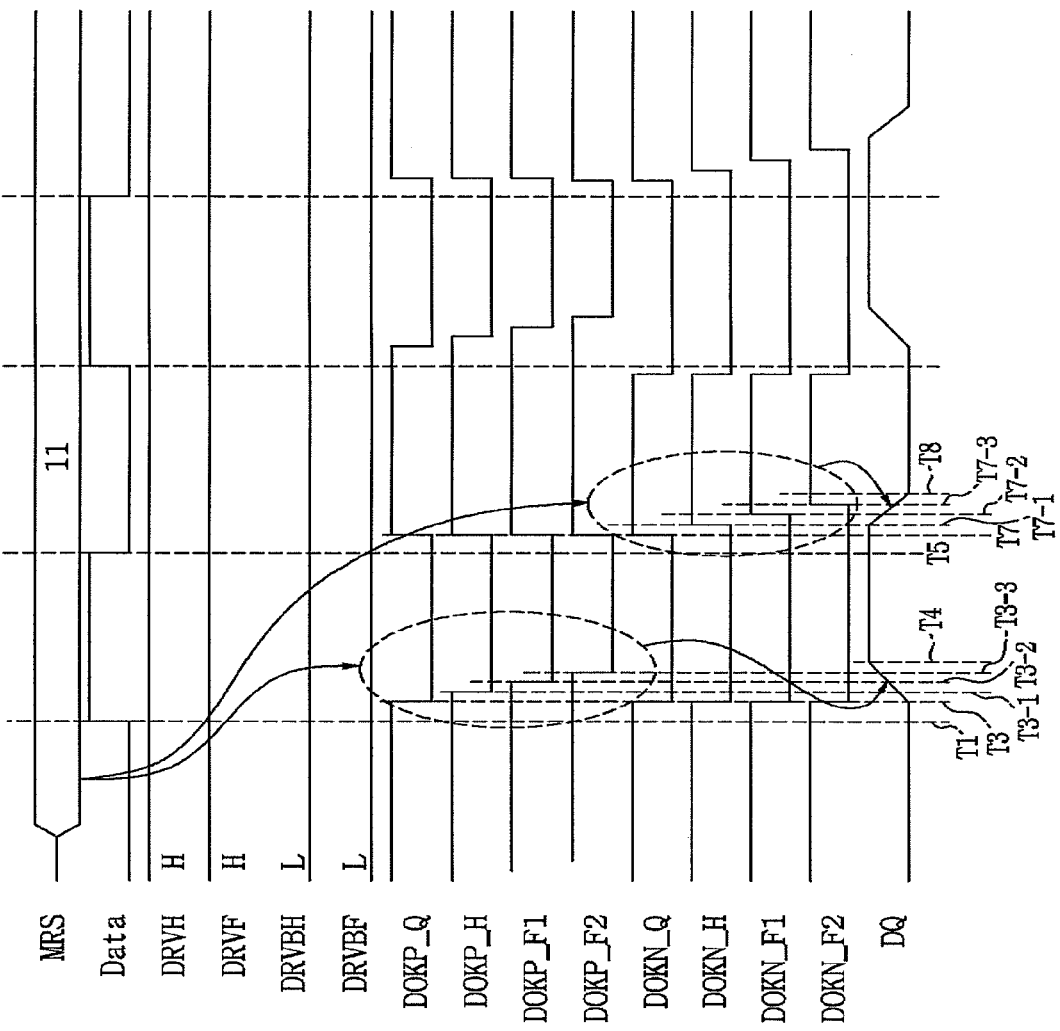

SEMICONDUCTOR DEVICE

CROSS-REFERENCE TO RELATED APPLICATION

This application claims under 35 U.S.C. §119 priority to and the benefit of Korean Patent Application No. 10-2009-0028200, filed on Apr. 1, 2009, the entire content of which is incorporated by reference herein.

BACKGROUND

1. Technical Field

The present disclosure relates to semiconductor devices, and more particularly, to a low-power mobile semiconductor device.

2. Discussion of Related Art

Modern mobile semiconductor devices typically employ drivers for pulling output data up and down. Such semiconductor devices have a need for maintaining a constant slew rate when output driving changes between a full driving operation and a half driving operation so as to avoid phenomena such as overshoot, undershoot, and crosstalk that can result from an increasing slew rate.

SUMMARY

Exemplary embodiments provide a semiconductor device in which driving ability of a driver for pulling output data up and down can be adjusted according to a change of output driving ability of the semiconductor device.

In accordance with an exemplary embodiment a semiconductor device includes a pull-up slew rate controller configured to receive a first driving control signal generated in a first mode of operation, a second driving control signal generated in a second mode of operation, and data, and upon a first transition of the data, to sequentially activate the data and a first pull-up delayed signal having different delay times in the first mode of operation and to sequentially activate the data and the first pull-up delayed signal, a second pull-up delayed signal and a third pull-up delayed signal, each having different delay times in the second mode of operation. A pull-up driving unit is configured to sequentially pull a data output terminal up in response to the data and the first pull-up delayed signal, the second pull-up delayed signal and the third pull-up delayed signal. A pull-down slew rate controller is configured to, upon a second transition of the data, sequentially activate the data and a first pull-down delayed signal having different delay times in the first mode of operation and to sequentially activate the data and the first pull-down delayed signal, a second pull-down delayed signal and a third pull-down delayed signal, each having different delay times in the second mode of operation. A pull-down driving unit is configured to sequentially pull the data output terminal down in response to the data and the first pull-down delayed signal, the second pull-down delayed signal and the third pull-down delayed signal.

The pull-up slew rate controller may include a first asymmetrical delay unit configured to delay the data by a greater delay time upon the first transition of the data than upon the second transition to output the first pull-up delayed signal, a second asymmetrical delay unit configured to delay the first pull-up delayed signal by a greater delay time upon a first transition of the first pull-up delayed signal than upon a second transition thereof to output the second pull-up delayed signal, and a third asymmetrical delay unit configured to delay the second pull-up delayed signal by a greater delay time upon a first transition of the second pull-up delayed signal than upon a second transition thereof to output the third pull-up delayed signal.

Each of the first asymmetrical delay unit, the second asymmetrical delay unit and the third asymmetrical delay unit may include a NAND gate configured to receive one of the data and the first pull-up delayed signal and second pull-up delayed signal, to receive the first driving control signal or the second driving control signal, and perform a NAND operation on the one of the data and the first pull-up delayed signal and the second pull-up delayed signal and the first driving control signal or the second driving control signal, and a plurality of inverters each including pull-up and pull-down devices having different channel sizes and configured to sequentially invert and delay an output signal of the NAND gate, wherein each inverter delays the output signal of the NAND gate through one having a smaller channel size of the pull-up and pull-down devices upon the first transition of the data than upon the second transition.

Each of the first asymmetrical delay unit, the second asymmetrical delay unit and the third asymmetrical delay unit may include a NAND gate configured to receive one of the data and the first pull-up delayed signal and the second pull-up delayed signal, receive the first driving control signal or the second driving control signal, and perform a NAND operation on the one of the data and the first pull-up delayed signal and the second pull-up delayed signal and the first driving control signal or the second driving control signal, an inverter group including an even number of inverters and configured to delay an output signal of the NAND gate by a predetermined time, and a NOR gate configured to perform a NOR operation on the output signal of the NAND gate and an output signal of the inverter group to output the first pull-up delayed signal, the second pull-up delayed signal and the third pull-up delayed signal.

The pull-down slew rate controller may include a first asymmetrical delay unit configured to delay the data by a greater delay time upon the second transition of the data than upon the first transition to output the first pull-down delayed signal, a second asymmetrical delay unit configured to delay the first pull-down delayed signal by a greater delay time upon a second transition of the first pull-down delayed signal than upon a first transition thereof to output the second pull-down delayed signal, and a third asymmetrical delay unit configured to delay the second pull-down delayed signal by a greater delay time upon a second transition of the second pull-down delayed signal than upon a first transition thereof to output the third delay pull-down data.

Each of the first asymmetrical delay unit, the second asymmetrical delay unit and the third asymmetrical delay unit may include a NOR gate configured to receive one of the data and the first pull-down delayed signal and the second pull-down delayed signal, to receive a first driving control signal or second inverted driving control signal, and perform a NOR operation on the one of the data and the first pull-down delayed signal and the second pull-down delayed signal and the first inverted driving control signal or second inverted driving control signal, and a plurality of inverters each including pull-up and pull-down devices having different line widths and configured to sequentially invert and delay an output signal of the NOR gate, wherein each inverter delays the output signal of the NOR gate through one having a smaller line width of the pull-up and pull-down devices upon the first transition of the data than upon the second transition.

Each of the first asymmetrical delay unit, the second asymmetrical delay unit and the third asymmetrical delay unit may include a NOR gate configured to receive one of the data and the first pull-up delayed signal and the second pull-up delayed signal, to receive the first driving control signal or the second driving control signal, and to perform a NOR operation on the one of the data and the first pull-up delayed signal and the second pull-up delayed signal and the first driving control signal or the second driving control signal, an inverter group comprising an even number of inverters and configured to delay an output signal of the NOR gate by a predetermined time, and a NAND gate configured to receive the output signal of the NOR gate and an output signal of the inverter group and configured to perform a NAND operation on the output signal of the NOR gate and the output signal of the inverter group to output the first pull-down delayed signal, the second pull-down delayed signal, and the third pull-down delayed signal.

The pull-up driving unit may include a pull-up pre-driver configured to invert the data and the first pull-up delayed signal, the second pull-up delayed signal and the third pull-up delayed signal to output a plurality of pull-up control signals, and a pull-up driver including a first pull-up device, a second pull-up device, a third pull-up device and a fourth pull-up device for pulling the data output terminal up in response to the respective pull-up control signals. The first pull-up device and the second pull-up device may be sequentially turned on in response to the first pull-up control signal and the second pull-up control signal in the first mode of operation, and the first pull-up device, the second pull-up device, the third pull-up device and the fourth pull-up device are sequentially turned on in response to the first pull-up control signal, the second pull-up control signal, the third pull-up control signal, and the fourth pull-up control signal in the second mode of operation.

The pull-down driving unit may include a pull-down pre-driver configured to invert the data and the first pull-down delayed signal, the second pull-down delayed signal and the third pull-down delayed signal to output a plurality of pull-down control signals, and a pull-down driver including a first pull-down device, a second pull-down device and a fourth pull-down device for pulling the data output terminal down in response to the respective pull-down control signals. The first pull-down device and the second pull-down device may be sequentially turned on in response to the first pull-down control signal and the second pull-down control signal in the first mode of operation, and the first pull-down device, the second pull-down device, the third pull-down device to fourth pull-down device are sequentially turned on in response to the first pull-down control signal, the second pull-down control signal, the third pull-down control signal and the fourth pull-down control signal in the second mode of operation.

In accordance with an exemplary embodiment a pull-up pull-down driving apparatus for maintaining a constant slew rate when output driving changes between a full driving operation and half driving operation is provided. A pull-up driver includes a first pull-up transistor, a second pull-up transistor, a third pull-up transistor and a fourth pull-up transistor coupled in parallel to a data output terminal for pulling the data output terminal up in response to the respective pull-up control signals, the first pull-up transistor and the second pull-up transistor being sequentially turned on in response to a first pull-up control signal and a second pull-up control signal in the half driving operation, and the first pull-up transistor, the second pull-up transistor, the third pull-up transistor and the fourth pull-up transistor being sequentially turned on in response to the first pull-up control signal, a second pull-up control signal, a third pull-up control signal, and a fourth pull-up control signal in the full driving operation. A pull-down driver includes a first pull-down transistor, a second pull-down transistor and a fourth pull-down transistor for pulling the data output terminal down in response to the respective pull-down control signals, the first pull-down transistor and the second pull-down transistor being sequentially turned on in response to the first pull-down control signal and the second pull-down control signal in the half driving operation, and the first pull-down transistor, the second pull-down transistor, the third pull-down transistor and fourth pull-down transistor being sequentially turned on in response to the first pull-down control signal, the second pull-down control signal, the third pull-down control signal and the fourth pull-down control signal in the full driving operation.

The pull-up pull-down driving apparatus may further include a pull-up pre-driver coupled to the pull-up driver and configured to invert data being provided to the data output terminal and a first pull-up delayed signal, a second pull-up delayed signal and a third pull-up delayed signal to output the respective first pull-up control signal, the second pull-up control signal, the third pull up control signal and the fourth pull-up control signal.

The pull-up pull-down driving apparatus may further include a pull-down pre-driver coupled to the pull-down driver and configured to invert a data being provided to the data output terminal and a first pull-down delayed signal, a second pull-down delayed signal and a third pull-down delayed signal to output the respective first pull-down control signal, the second pull-down control signal, the third pull-down control signal and the fourth pull-down control signal.

BRIEF DESCRIPTION OF THE DRAWINGS

Exemplary embodiments are described in further detail below with reference to the accompanying drawings. It should be understood that various aspects of the drawings may have been exaggerated for clarity.

FIG. 9 is an operational timing diagram when a driving ability of a semiconductor device is set to full driving ability according to an exemplary embodiment of the inventive concept.

DETAILED DESCRIPTION OF THE EMBODIMENTS

Various exemplary embodiments will now be described more fully with reference to the accompanying drawings in which exemplary embodiments are shown. However, specific structural and functional details disclosed herein are merely representative for purposes of describing the exemplary embodiments. The present inventive concept, however, may be embodied in many alternate forms and should not be construed as limited to only the exemplary embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. Other words used to describe the relationship between elements should be interpreted in a like fashion (e.g., "between" versus "directly between," "adjacent" versus "directly adjacent," etc.).

In order to more specifically describe the exemplary embodiments, various aspects will now be described in detail with reference to the attached drawings. Like numbers refer to like elements throughout the description of the figures.

Figure 1:
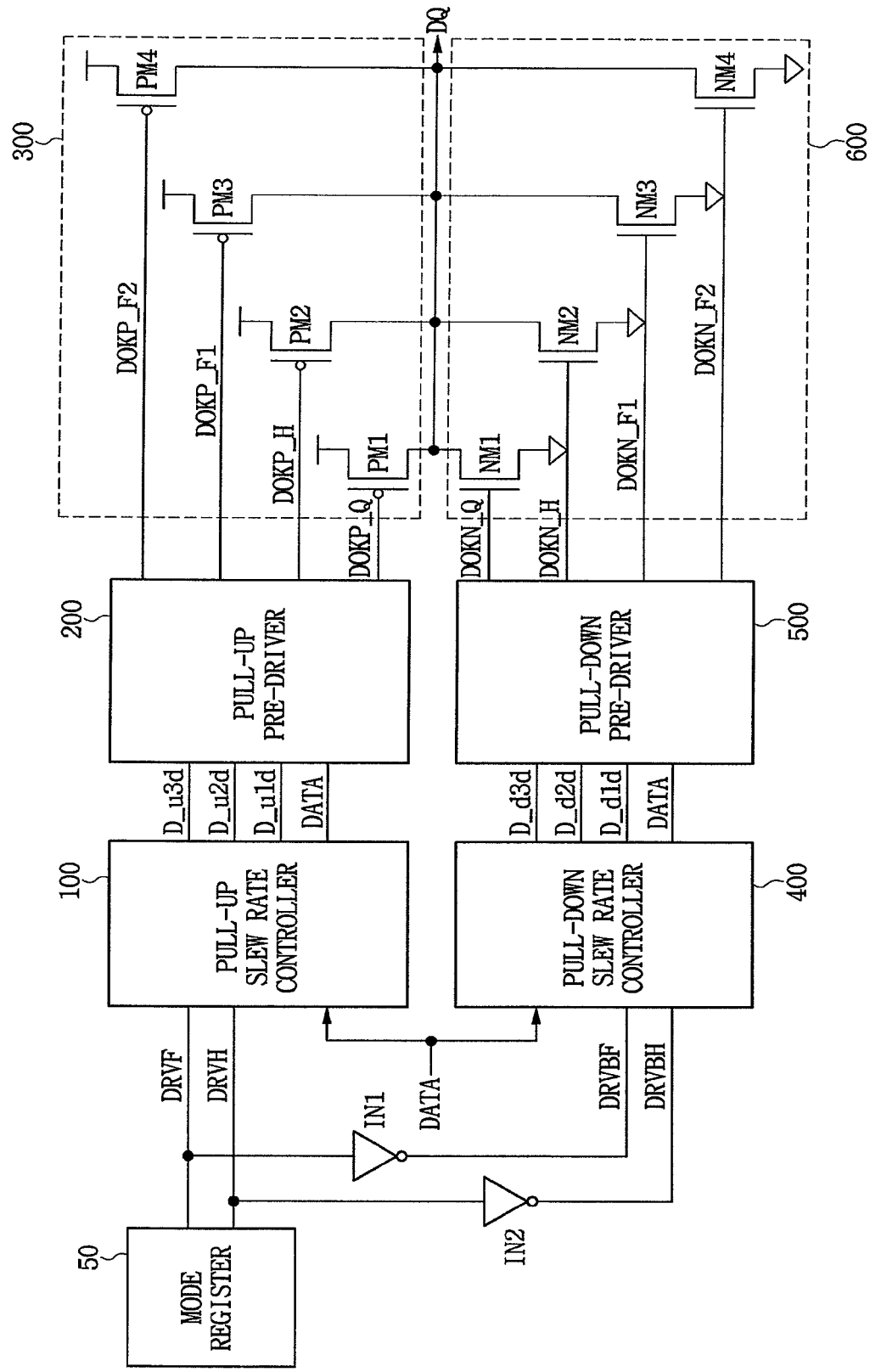
FIG. 1 is a block diagram of a semiconductor device and a mode register according to an exemplary embodiment of the inventive concept.

FIG. 1 is a block diagram of a semiconductor device according to an exemplary embodiment of the inventive concept. The semiconductor device includes a mode register 50, inverters IN1, IN2, a pull-up slew rate controller 100, a pull-up pre-driver 200, a pull-up driver 300, a pull-down slew rate controller 400, a pull-down pre-driver 500 and a pull-down driver 600.

The pull-up driver 300 includes PMOS transistors PM1, PM2, PM3, PM4 and the pull-down driver 600 includes NMOS transistors NM1, NM2, NM3, NM4.

The mode register 50 outputs first driving control signals DRVH, DRVF that are a combination of a half driving ability bit and a full driving ability bit according to a desired driving ability. The mode register 50 outputs the first driving control signals DRVH, DRVF as "10" for the half driving ability, and outputs the first driving control signals DRVH, DRVF as "11" for the full driving ability.

The inverters IN1, IN2 invert the first driving control signals DRVH, DRVF respectively to output second driving control signals DRVBH, DRVBF. That is, the second driving control signals DRVBH, DRVBF become "01" for the half driving ability, and "00" for the full driving ability.

The pull-up slew rate controller 100 receives data DATA, differently delays the data DATA upon a first transition from a low level to a high level and a second transition from a high level to a low level, and sequentially outputs the data DATA and first to third pull-up delayed signals D_u1d, D_u2d, D_u3d. The pull-up slew rate controller 100 transitions some of the first to third pull-up delayed signals D_u1d, D_u2d, D_u3d to a low level in response to the first driving control signals DRVH, DRVF. That is, the pull-up slew rate controller 100 sets a pull-up driving ability and a pull-down driving ability differently.

The pull-up pre-driver 200 receives the data DATA and the first to third pull-up delayed signals D_u1d, D_u2d, D_u3d, inverts the data DATA and the first to third pull-up delayed signals D_u1d, D_u2d, D_u3d, and delays the data DATA and the signals by a predetermined time to output pull-up control signals DOKP_Q, DOKP_H, DOKP_F1, DOKP_F2.

That is, the pull-up slew rate controller 100 and the pull-up pre-driver 200 receive the data DATA and sequentially generate the data DATA and the first pull-up delayed signal D_u1d having different delay times in a first mode of operation in which the half driving ability is required. Also, the pull-up slew rate controller 100 and the pull-up pre-driver 200 sequentially generate the data DATA and the first to third pull-up delayed signals D_u1d, D_u2d, D_u3d having different delay times in a second mode of operation in which the full driving ability is required.

The PMOS transistors PM1, PM2, PM3, PM4 receive an external supply voltage VDD and output the external supply voltage VDD to a data output terminal DQ in response to pull-up control signals DOKP_Q, DOKP_H, DOKP_F1, DOKP_F2, respectively.

The pull-down slew rate controller 400 receives the data DATA, differently delays the data DATA upon first and second transitions, and sequentially outputs the data DATA and the first to third pull-down delayed signals D_d1d, D_d2d, D_d3d. The pull-down slew rate controller 400 transitions some of the data DATA and the first to third pull-down delayed signals D_d1d, D_d2d, D_d3d to a low level in response to the second driving control signals DRVBH, DRVBF.

The pull-down pre-driver 500 receives the data DATA and the first to third pull-down delayed signals D_d1d, D_d2d, D_d3d, inverts the data DATA and the first to third pull-down delayed signals D_d1d, D_d2d, D_d3d, and delays the data DATA and the first to third pull-down delayed signals D_d1d, D_d2d, D_d3d by a predetermined time to output pull-down control signals DOKN_Q, DOKN_H, DOKN_F1, DOKN_F2.

That is, the pull-down slew rate controller 400 and the pull-down pre-driver 500 sequentially generate the data DATA and the first pull-down delayed signal D_d1d having different delay times in a first mode of operation, and sequentially generate the data DATA and the first to third pull-down delayed signals D_d1d, D_d2d, D_d3d having different delay times in a second mode of operation.

NMOS transistors NM1, NM2, NM3, NM4 receive a ground voltage and output the ground voltage to the data output terminal DQ in response to pull-down control signals DOKN_Q, DOKN_H, DOKN_F1, DOKN_F2.

Figure 2:
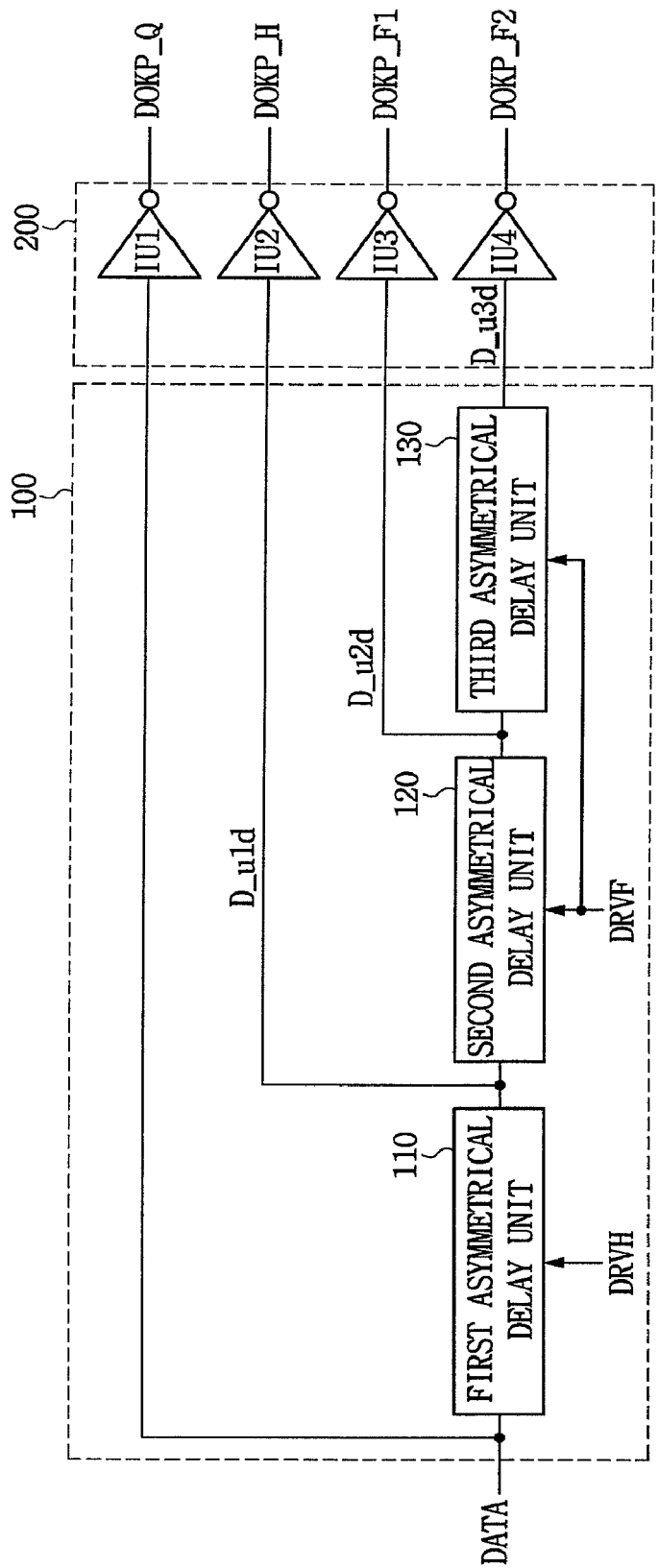
FIG. 2 is a circuit diagram of a pull-up slew rate controller and a pull-up pre-driver in FIG. 1.

FIG. 2 is a circuit diagram of the pull-up slew rate controller 100 and the pull-up pre-driver 200 in FIG. 1. The pull-up slew rate controller 100 includes first asymmetrical delay unit 110, second asymmetrical unit 120, third asymmetrical unit 130, and the pull-up pre-driver 200 includes first inverter IU1, second inverter IU2, third inverter IU3 and fourth inverter IU4.

The first asymmetrical delay unit 110 differently delays the data DATA upon the first and second transitions in response to the first driving control signal DRVH, and outputs the first pull-up delayed signal D_u1d.

The second asymmetrical delay unit 120 receives the first pull-up delayed signal D_u1d, differently delays the first pull-up delayed signal D_u1d upon the first and second transitions in response to the first driving control signal DRVF, and outputs the second pull-up delayed signal D_u2d.

The third asymmetrical delay unit 130 receives the second pull-up delayed signal D_u2d, differently delays the second pull-up delayed signal D_u2d upon the first and second transitions in response to the first driving control signal DRVF, and outputs the third pull-up delayed signal D_u3d.

The first to fourth inverters IU1, IU2, IU3, IU4 receive the data DATA and the first to third pull-up delayed signals D_u1d, D_u2d, D_u3d, respectively, invert the data and the first to third pull-up delayed signals D_u1d, D_u2d, D_u3d, and delay the data DATA and the first to third pull-up delayed signals D_u1d, D_u2d, D_u3d by a predetermined time to output pull-up control signals DOKP_Q, DOKP_H, DOKP_F1, DOKP_F2.

Figure 3:
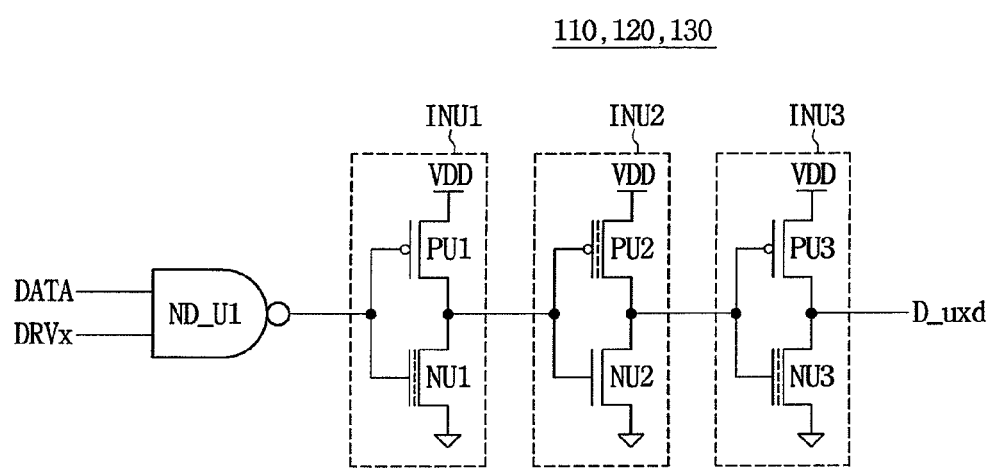
FIG. 3 is a circuit diagram of each of first to third asymmetrical delay units of the pull-up slew rate controller in FIG. 2 according to a first exemplary embodiment.

FIG. 3 is a circuit diagram of the first to third asymmetrical delay units 110, 120, 130 of the pull-up slew rate controller 100 in FIG. 2 according to a first exemplary embodiment. Each asymmetrical delay unit includes a NAND gate ND_U1 and inverters INU1, INU2, INU3 connected in series.

The NAND gate ND_U1 receives the data DATA or the pull-up delayed signal D_u1d or D_u2d and the first driving control signal DRVx (i.e., DRVH or DRVF), and performs a NAND operation on the data and/or the signals. That is, the NAND gate ND_U1 inverts and outputs the data DATA or the pull-up delayed signals D_u1d or D_u2d when the first driving control signal DRVH or DRVF is at a high level, and outputs a high level signal when the first driving control signal DRVH or DRVF is at a low level.

The inverters INU1, INU2, INU3 sequentially invert an output signal of the NAND gate ND_U1 and output the pull-up delayed signals D_uxd (i.e., D_u1d, D_u2d, D_u3d). In the inverters INU1, INU2, INU3, channel sizes of transistors PU1, NU2, PU3 are smaller than those of transistors NU1, PU2, NU3. Here, the inverters INU1, INU2, INU3 increase the delay time through transistors PU1, NU2, PU3 having relatively small channel sizes when the data DATA is at a high level, and decrease the delay time through transistors NU1, PU2, NU3 having relatively large channel sizes when the data DATA is at a low level.

That is, when the data DATA or the pull-up delayed signal D_u1d or the pull-up delayed signal D_u2d transitions from a low level to a high level, the data DATA is output through the transistors PU1, NU2, PU3 having relatively small channel sizes, such that a delay time increases, and when the data DATA or the pull-up delayed signal D_u1d or the pull-up delayed signal D_u2d transitions from a high level to a low level, the data DATA is output through the transistors NU1, PU2, NU3 having relatively large channel sizes, such that the delay time decreases.

Thus, the pull-up slew rate controller 100 increases the delay time when the data DATA at a high level is input more than that when the data DATA at a low level is input, and sequentially outputs the first to third pull-up delayed signals D_uxd (i.e., D_u1d, D_u2d, D_u3d).

Figure 4:
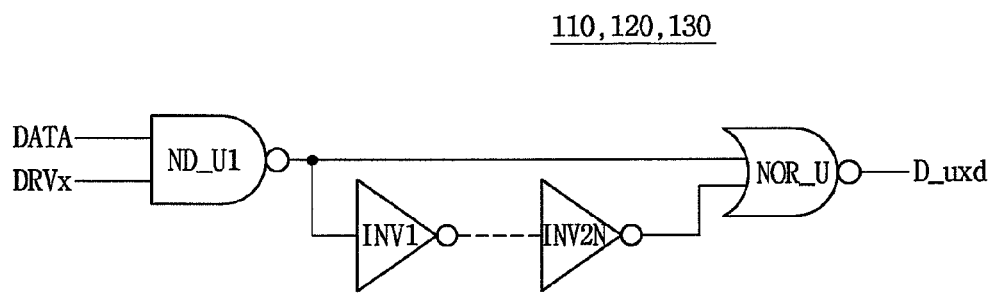
FIG. 4 is a circuit diagram of each of the first to third asymmetrical delay units of the pull-up slew rate controller in FIG. 2 according to a second exemplary embodiment.

FIG. 4 is a circuit diagram of each of the first to third asymmetrical delay units 110, 120, 130 of the pull-up slew rate controller 100 in FIG. 2 according to a second exemplary embodiment. The first to third asymmetrical delay units 110, 120, 130 respectively includes a NAND gate ND_U1, an even number of inverters INV1, INV2N, and a NOR gate NOR_U.

The NAND gate ND_U1 receives the data DATA or the pull-up delayed signal D_u1d or the pull-up delayed signal D_u2d and the first driving control signal DRVH or DRVF, and performs a NAND operation.

The even number of inverters INV1, . . . INV2N receive an output signal of the NAND gate ND_U1 and delay the output signal by a predetermined time.

The NOR gate NOR_U receives the output signal of the NAND gate ND_U1 and the delayed data, performs a NOR operation on the output signal and the delayed data, and outputs a pull-up delayed signal D_uxd (i.e., D_u1d, D_u2d or D_u3d).

When the first driving control signal DRVH or DRVF is at a high level, the asymmetrical delay unit delays the data DATA or the pull-up delayed signal D_u1d or D_u2d. In this case, when the data DATA or the pull-up delayed signal D_u1d or D_u2d transitions from a low level to a high level, the output signal of the NAND gate ND_U1 is delayed by a predetermined time through the inverters INV1, . . . INV2N and then an output data of the NOR gate NOR_U is activated to a high level. On the other hand, when the data DATA or the pull-up delayed signal D_u1d or D_u2d transitions from a high level to a low level, the output data of the NOR gate NOR_U directly transitions to a low level.

Meanwhile, when the first driving control signal DRVH or DRVF is at a low level, the output data of the NOR gate NOR_U is inactivated to a low level.

Figure 5:
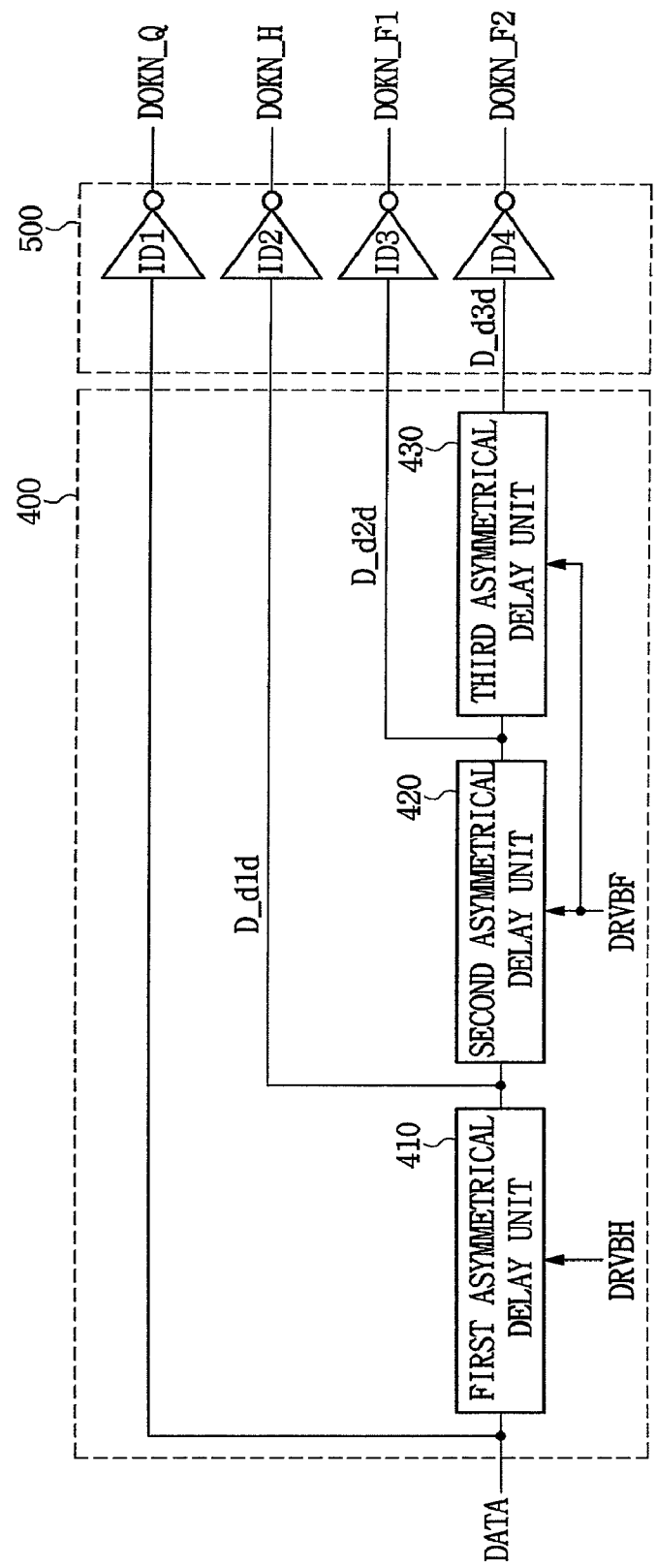
FIG. 5 is a circuit diagram of a pull-down slew rate controller and a pull-down pre-driver in FIG. 1.

FIG. 5 is a circuit diagram of the pull-down slew rate controller 400 and the pull-down pre-driver 500 in FIG. 1. The pull-down slew rate controller 400 includes first to third asymmetrical delay units 410, 420, 430, and the pull-down pre-driver 500 includes first to fourth inverters ID1, ID2, ID3, ID4.

The first asymmetrical delay unit 410 receives the data DATA, differently delays the data DATA upon first and second transitions in response to the second driving control signal DRVBH, and outputs the first pull-down delayed signal D_d1d. That is, the first asymmetrical delay unit 410 applies different delay times in the data pull-up and pull-down operations.

The second asymmetrical delay unit 420 receives the first pull-down delayed signal D_d1d, differently delays the first pull-down delayed signal D_d1d upon first and second transitions in response to the second driving control signal DRVBF, and outputs the second pull-down delayed signal D_d2d.

The third asymmetrical delay unit 430 receives the second pull-down delayed signal D_d2d, differently delays the second pull-down delayed signal D_d2d upon first and second transitions in response to the second driving control signal DRVBF, and outputs the third pull-down delayed signal D_d3d.

The first to fourth inverters ID1, ID2, ID3, ID4 receive the data DATA and the first to third pull-down delayed signals D_d1d, D_d2d, D_d3d, respectively, invert the data DATA and the first to third pull-down delayed signals D_d1d, D_d2d, D_d3d, and then delay the data DATA and the first to third pull-down delayed signals D_d1d, D_d2d, D_d3d by a predetermined time to output pull-down control signals DOKN_Q, DOKN_H, DOKN_F1, DOKN_F2.

Figure 6:
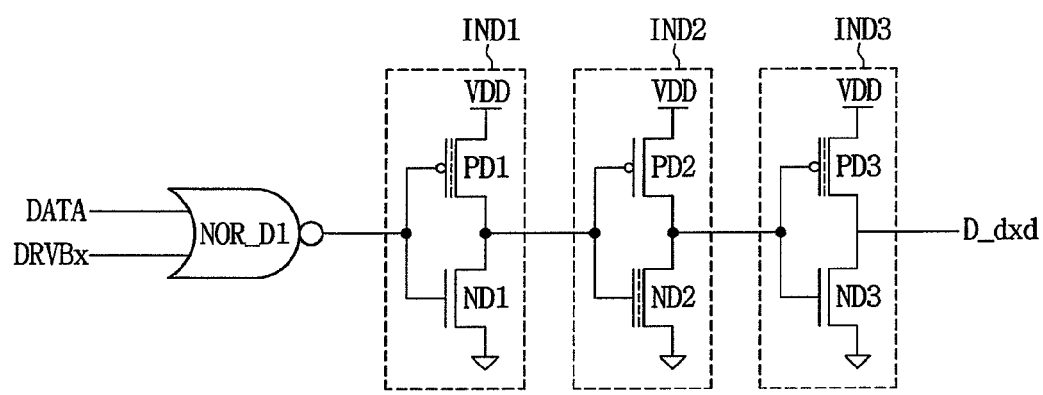
FIG. 6 is a circuit diagram of each of first to third asymmetrical delay units of the pull-down slew rate controller in FIG. 5 according to a first exemplary embodiment.

FIG. 6 is a circuit diagram of the first to third asymmetrical delay units 410, 420, 430 of the pull-down slew rate controller 400 in FIG. 5 according to the first exemplary embodiment. Each asymmetrical delay unit includes a NOR gate NOR_D1 and inverters IND1, IND2, IND3 connected in series.

The NOR gate NOR_D1 receives the data DATA or the pull-down delayed signal D_d1d or the pull-down delayed signal D_d2d and the second driving control signal DRVBH or the second driving control signal DRVBF and performs a NOR operation.

Inverters IND1, IND2, IND3 sequentially invert the output signal of the NOR gate NOR_D1 and the output pull-down delayed signal D_d1d, the output pull-down delayed signal D_d2d or the output pull-down delayed signal D_d3d. Here, the inverters IND1, IND2, IND3 increase the delay time through transistors ND1, PD2, ND3 having relatively small channel sizes when the data DATA is at a low level, and decrease the delay time through transistors PD1, ND2, PD3 having relatively small channel sizes when the data DATA is at a high level.

Thus, the pull-down slew rate controller 400 increases each delay time when the data DATA at a low level is input more than that when data DATA at a high level is input, and sequentially outputs the first to third pull-down delayed signals D_dxd (i.e., D_d1d, D_d2d, D_d3d).

Figure 7:
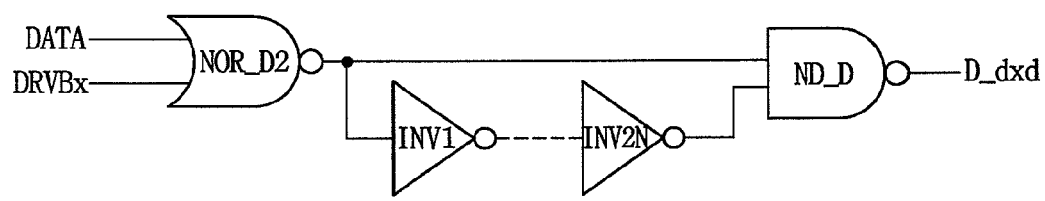
FIG. 7 is a circuit diagram of each of the first to third asymmetrical delay units of the pull-down slew rate controller in FIG. 5 according to a second exemplary embodiment.

FIG. 7 is a circuit diagram of the first to third asymmetrical delay units 410, 420, 430 of the pull-down slew rate controller 400 in FIG. 5 according to a second exemplary embodiment. Each asymmetrical delay unit includes a NOR gate NOR_D2, an even number of inverters INV1, ... NV2N, and a NAND gate ND_D.

The NOR gate NOR_D2 receives the data DATA or the pull-down delayed signal D_d1d or the pull-down delayed signal D_d2d and the second driving control signal DRVBH or the second driving control signal DRVBF, and performs a NOR operation.

The even number of inverters INV1, ... INV2N receive the output signal of the NOR gate NOR_D2, and delay the output signal by a predetermined time.

The NAND gate ND_D performs a NAND operation on the output signal of the NOR gate NOR_D2 and the output signal of the inverter INV2N, and outputs first to third pull-down delayed signals D_dxd (i.e., D_d1d, D_d2d D_d3d).

Figure 8:
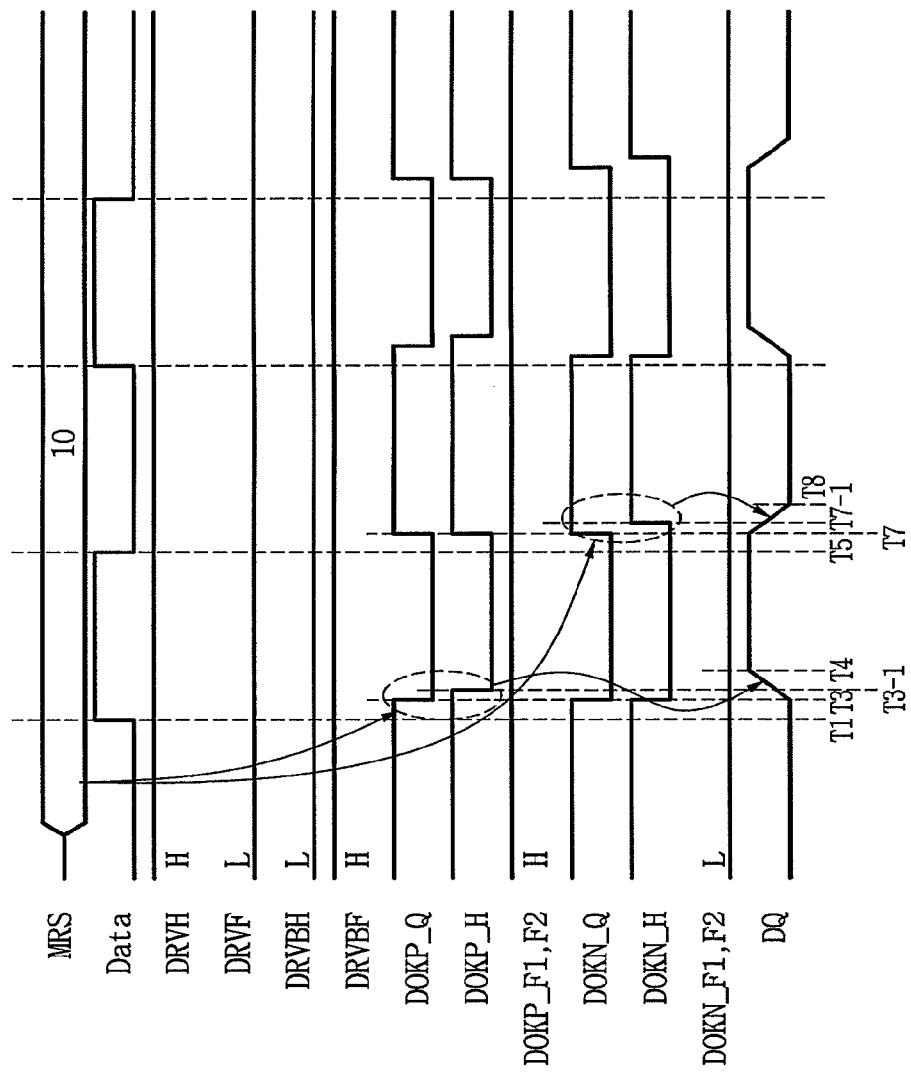
FIG. 8 is an operational timing diagram when a driving ability of a semiconductor device is set to half driving ability according to an exemplary embodiment of the inventive concept.

FIG. 8 is an operational timing diagram when a driving ability of the semiconductor device is set to a half driving ability according to an exemplary embodiment of the inventive concept, i.e., waveforms of the mode register set signal MRS, the data DATA, the first driving control signal DRVH and the first driving control signal DRVF, the second driving control signal DRVBH and second driving control signals DRVBF, the quarter pull-up control signal DOKP_Q, the half pull-up control signal DOKP_H, the first and second full pull-up control signals DOKP_F1, DOKP_F2, the quarter pull-down control signal DOKN_Q, the half pull-down control signal DOKN_H, the first and second full pull-down control signals DOKN_F1, DOKN_F2, and a signal on a data output terminal DQ.

The mode register set signal MRS loads "10" to set the driving ability of the semiconductor device to the half driving ability.

The data DATA is initially at a low level, transitions to a high level at a time point T1, and transitions again to the low level at a time point T5.

The first driving control signal DRVH remains at a high level in response to the mode register set signal MRS loaded as "10".

The first driving control signal DRVF remains at a low level in response to the mode register set signal MRS loaded as "10".

The second driving control signal DRVBH remains at a low level in response to the mode register set signal MRS loaded as "10".

The second driving control signal DRVBF remains at a high level in response to the mode register set signal MRS loaded as "10".

The quarter pull-up control signal DOKP_Q is initially at a high level in response to the mode register set signal MRS loaded as "10", is activated to a low level at a time point T3 after a predetermined time lapses from the time point T1, and is again inactivated to the high level at the time point T7 after a predetermined time lapses from the time point T5.

The half pull-up control signal DOKP_H is initially at a high level in response to the mode register set signal MRS loaded as "10", transitions to a low level at a time point T3-1 later than the time point T3 by a predetermined time, and is again inactivated to the high level at the time point T7 after a predetermined time lapses from the time point T5.

The first and second full pull-up control signals DOKP_F1, DOKP_F2 remain in an inactivation state of a high level when the first driving control signal DRVF is inactivated to the low level.

Meanwhile, the quarter pull-down control signal DOKN_Q is initially at a high level, is inactivated to the low level at a time point T3, and is again activated to the high level at a time point T7 later than the time point T5 by a predetermined time.

The half pull-down control signal DOKN_H is initially at a high level, is inactivated to the low level at a time point T3, and is again activated to the high level at a time point T7-1 later than the time point T7 by a predetermined time.

The first and second full pull-down control signals DOKN_F1, DOKN_F2 remain in the inactivation state of the low level when the first driving control signal DRVF is inactivated to the low level.

The data output terminal DQ is initially at a low level. The data output terminal DQ is pulled up to the high level with a predetermined slope at a time point T4 as the quarter pull-up control signal DOKP_Q or the half pull-up control signal DOKP_H is activated to the low level, and pulled down to the low level with a predetermined slope at a time point T8 as the quarter pull-down control signal DOKN_Q or the half pull-down control signal DOKN_H is activated to the high level.

That is, when the half driving ability is set, the semiconductor device according to an exemplary embodiment of the inventive concept activates or inactivates only the quarter pull-up control signal DOKP_Q and the half pull-up control signal DOKP_H or the quarter pull-down control signal DOKN_Q and the half pull-down control signal DOKN_H according to the level of the data DATA.

Thus, in the semiconductor device set to the half driving ability, when the data DATA is at a high level, the semiconductor device sequentially activates the quarter pull-up control signal DOKP_Q and the half pull-up control signal DOKP_H, and thus the driving ability of the pull-up driver 300, which pulls up the data output terminal DQ, increases stepwise. When the data DATA is at a low level, the semiconductor device sequentially activates the quarter pull-down control signal DOKN_Q and the half pull-down control signal DOKN_H, and thus the driving ability of the pull-down driver 600, which pulls down the data output terminal DQ, increases stepwise.

FIG. 9 is an operational timing diagram when the driving ability of the semiconductor device is set to a full driving ability according to an exemplary embodiment of the inventive concept, i.e., waveforms of the mode register set signal MRS, the data DATA, the first driving control signal DRVH, the first driving control signal DRVF, the second driving control signal DRVBH, the second driving control signal DRVBF, the quarter pull-up control signal DOKP_Q, the half pull-up control signal DOKP_H, the first full pull-up control signal DOKP_F1, the second full pull-up control signal DOKP_F2, the quarter pull-down control signal DOKN_Q, the half pull-down control signal DOKN_H, the first full pull-down control signal DOKN_F1, the second full pull-down control signal DOKN_F2 and the signal on the data output terminal DQ.

Differences between the timing diagrams in FIGS. 8 and 9 will now be described.

The mode register set signal MRS loads "11" to set the driving ability of the semiconductor device to the full driving ability.

The first driving control signal DRVH remains at a high level in response to the mode register set signal MRS loaded as "11".

The first driving control signal DRVF remains at a high level in response to the mode register set signal MRS loaded as "11".

The second driving control signal DRVBH remains at a low level in response to the mode register set signal MRS loaded as "11".

The second driving control signal DRVBF remains at a low level in response to the mode register set signal MRS loaded as "11".

In response to the mode register set signal MRS loaded as "11", the first full pull-up control signal DOKP_F1 is initially at a high level, is activated to a low level at a time point T3-2 later than the time point T3-1 by a predetermined time, and is again inactivated to the high level at a time point T6 after a predetermined time lapses from the time point T5.

In response to the mode register set signal MRS, the second full pull-up control signal DOKP_F2 is initially at a high level, is activated to a low level at a time point T3-3 later than the time point T3-2 by a predetermined time, and is again inactivated to the high level at a time point T7 after a predetermined time lapses from the time point T5.

Meanwhile, the first full pull-down control signal DOKN_F1 is initially at a high level, is inactivated to the low level at a time point T3, and is again activated to the high level at a time point T7-2 later than the time point T7-1 by a predetermined time.

The second full pull-down control signal DOKN_F2 is initially at a high level, is inactivated to the low level at a time point T3, and is again activated to the high level at a time point T7-3 later than the time point T7-2 by a predetermined time.

Accordingly, as the quarter pull-up control signal DOKP_Q, the half pull-up control signal DOKP_H, and the first and second full pull-up control signals DOKP_F1, DOKP_F2 are activated to the low level, the data output terminal DQ is pulled up to the high level with the same slope as that in the half driving ability, at a time point T4-1. Also, as the quarter pull-down control signal DOKN_Q, the half pull-down control signal DOKN_H, and the first and second full pull-down control signals DOKN_F1, DOKN_F2 are activated to the high level, and the data output terminal DQ is pulled down to the low level at a time point T8-1 with the same slope as that at the half driving ability.

Thus, in the semiconductor device set to the full driving ability, when the data DATA is at a high level, the semiconductor device sequentially activates pull-up control signals OKP_Q, DOKP_H, DOKP_F1, DOKP_F2, and thus the driving ability of the pull-up driver 300, which pulls up the data output terminal DQ, increases stepwise. Meanwhile, when the data DATA is at a low level, the semiconductor device sequentially activates the pull-down control signals DOKN_Q, DOKN_H, DOKN_F1, DOKN_F2, and thus the driving ability of the pull-down driver 600, which pulls down the data output terminal DQ, increases stepwise.

The operation of the semiconductor device according to the first exemplary embodiment of the inventive concept will now be described with reference to FIGS. 1 to 9.

In a signal integrity simulation or a mounting test for the mobile semiconductor device, a quarter driving operation performing a pull-up driving operation using one of the PMOS transistors PM1, PM2, PM3, PM4 of the pull-up driver 300 or a pull-down driving operation using one of the NMOS transistors NM1, NM2, NM3, NM4 of the pull-down driver 600 is normally performed. However, a signal integrity problem, such as overshoot, undershoot, or crosstalk of the output data on the data output terminal DQ, occurs frequently in a half driving operation performing a pull-up or pull-down operation using two transistors or a full driving operation performing pull-up or pull-down driving using fours transistors.

Thus, in the semiconductor device of the inventive concept, the pull-up driving ability or the pull-down driving ability increases stepwise in the half or full driving operation. For example, the semiconductor device operates as the quarter driving operation is performed twice in the half driving operation, and the semiconductor device operates as the quarter driving operation is performed four times in the full driving operation.

The operation of the semiconductor device according to the first exemplary embodiment of the inventive concept will now be further described with reference to FIGS. 3 and 6.

First, it is assumed that the data DATA is at a high level.

The first asymmetrical delay unit 110 of the pull-up slew rate controller 100 receives the data DATA, differently delays the data DATA upon first and second transitions, and outputs the first pull-up delayed signal D_u1$d$. The second asymmetrical delay unit 120 receives the first pull-up delayed signal D_u1$d$, differently delays the first pull-up delayed signal D_u1$d$ upon first and second transitions in response to the first driving control signal DRVF, and outputs the second pull-up delayed signal D_u2$d$. The third asymmetrical delay unit 130 receives the second pull-up delayed signal D_u2$d$, differently delays the second pull-up delayed signal D_u2$d$ according to a level of the second pull-up delayed signal D_u2$d$ in response to the first driving control signal DRVF, and outputs the third pull-up delayed signal D_u3$d$.

If the driving ability of the semiconductor device is desired to be set to the half driving ability, the mode register 50 loads the mode register set signal MRS as "10". Accordingly, the first asymmetrical delay unit 110 receives the first driving control signal DRVH at a high level.

The NAND gate ND_U1 of the first asymmetrical delay unit 110 performs a NAND operation on the data DATA at a high level and the first driving control signal DRVH at a high level and outputs an output signal at a low level.

In the first asymmetrical delay unit 110, the first inverter INU1 of the inverters INU1, INU2, INU3 pulls the output node up to the external supply voltage VDD through the PMOS transistor PU1 having a relatively small channel size in response to the output signal of the NAND gate ND_U1. The second inverter INU2 pulls the output node down to the ground voltage through the NMOS transistor NU2 having a relatively small channel size in response to the external supply voltage VDD at a high level. The third inverter INU3 pulls the output node up to the external supply voltage VDD through the PMOS transistor PU3 having a relatively small channel size in response to the ground voltage at a low level. Thus, the first asymmetrical delay unit 110 differently delays the data in the pull-up and pull-down operations and outputs the first pull-up delayed signal D_u1$d$ at a high level.

Meanwhile, since the mode register 50 loads the mode register set signal MRS as "10", the second asymmetrical delay unit 120 and the third asymmetrical delay unit 130 receive the first driving control signal DRVF at a low level.

The NAND gate ND_U1 in the second asymmetrical delay unit 120 receives the first pull-up delayed signal D_u1$d$ at a high level and the first driving control signal DRVF at a low level, performs a NAND operation on the signals, and outputs an output signal at a high level.

In the second asymmetrical delay unit 120, the first inverter INU1 pulls the output node down to the ground voltage through the NMOS transistor NU1 having a relatively large channel size in response to the output signal of the NAND gate N_U1. The second inverter INU2 pulls the output node up to the external supply voltage VDD through the PMOS transistor PU2 having a relatively large channel size in response to the output signal of the first inverter INU1. The third inverter INU3 decreases a delay time to output the second pull-up delayed signal D_u2d at a low level when the NMOS transistor NU3 having a relatively large channel size is turned on in response to an output signal of the second inverter INU2 and outputs the ground voltage.

Similarly, the NAND gate ND_U1 in the third asymmetrical delay unit 130 performs a NAND operation on the second pull-up delayed signal D_u2d at a low level and the first driving control signal DRVF at a low level, and outputs an output signal at a high level. Accordingly, the first inverter INU1 performs a pull-down operation, the second inverter INU2 performs a pull-up operation, and the third inverter INU3 performs a pull-down operation and outputs the third pull-up delayed signal D_u3d at a low level.

This operation enables the pull-up slew rate controller 100 to sequentially output the data DATA and the first to third pull-up delayed signals D_uxd (i.e., D_u1d, D_u2d, D_u3d).

The pull-up pre-driver 200 receives the non-delayed data DATA at a high level and the first to third pull-up delayed signals D_u1d, D_u2d, D_u3d respectively at high, low and low levels delayed differently upon the first and second transitions, inverts the data DATA and the first to third pull-up delayed signals D_u1d, D_u2d, D_u3d, and delays the data DATA and the first to third pull-up delayed signals D_u1d, D_2d, D_u3d by a predetermined time to output pull-up control signals DOKP_Q, DOKP_H, DOKP_F1, DOKP_F2. In this case, the pull-up control signals DOKP_Q, DOKP_H, DOKP_F1, DOKP_F2 move to a low level, a low level, a high level and a high level, respectively.

The PMOS transistors PM1, PM2 of the pull-up driver 300 receive an external supply voltage VDD and are sequentially turned on according to the quarter pull-up control signal DOKP_Q and the half pull-up control signal DOKP_H sequentially activated to the low level. Meanwhile, the PMOS transistors PM3, PM4 are sequentially turned off in response to the first and second full pull-up control signals DOKP_F1, DOK_F2 sequentially inactivated to a high level. Accordingly, the pull-up driver 300 pulls the data output terminal DQ up using a pull-up driving ability increasing in two steps.

Referring to FIG. 8, the quarter pull-up control signal DOKP_Q is initially at a high level and transitions to a low level at a time point T3 after a predetermined time lapses from a time point T1, and the half pull-up control signal DOKP_H is initially at a high level and transitions to a low level at a time point T3-1 later than the time point T3 by a predetermined time. Accordingly, the data output terminal DQ is initially at a low level and transitions to a high level with a predetermined slope having a constant slew rate value at a time point T4. Meanwhile, the quarter pull-down control signal DOKN_Q again transitions to the high level at a time point T7 later than the time point T5 by a predetermined time and the half pull-down control signal DOKN_H again transitions to the high level at a time point T7-1 later than the time point T7 by a predetermined time. Accordingly, the data output terminal DQ transitions to a low level with a predetermined slope having a constant slew rate value at a time point T8. Although not shown, when the quarter pull-up control signal DOKP_Q is activated to the low level, the data output terminal DQ begins to be pulled up with a predetermined slope, and when the half pull-up control signal DOKP_H is activated to the low level, the level of the data output terminal DQ increases with a higher slope.

Meanwhile, the first asymmetrical delay unit 410 of the pull-down slew rate controller 400 receives the data DATA and differently delays the data DATA upon the first and second transitions to output the first pull-down delayed signal D_d1d in response to the second half driving control signal DRVBH. The second asymmetrical delay unit 420 receives the first pull-down delayed signal D_d1d and differently delays the first pull-down delayed signal D_d1d upon the first and second transitions to output the second pull-down delayed signal D_d2d in response to the second full driving control signal DRVBF. The third asymmetrical delay unit 430 receives the second pull-down delayed signal D_d2d and differently delays the second pull-down delayed signal D_d2d upon the first and second transitions to output the third pull-down delayed signal D_d3d in response to the second full driving control signal DRVBF.

When the mode register 50 loads the mode register set signal MRS as "10", the first asymmetrical delay unit 410 receives the second driving control signal DRVBH at a low level.

That is, the NOR gate NOR_D1 of the first asymmetrical delay unit 410 performs a NOR operation on the data DATA at a high level and the second driving control signal DRVBH at a low level to output an output signal at a low level.

In this case, the first inverter IND1 of the inverters IND1, IND2, IND3 in the first asymmetrical delay unit 410 pulls the output node up to the external supply voltage VDD using the PMOS transistor PD1 having a relatively large channel size in response to the output signal of the NOR gate NOR_D1. The second inverter IND2 pulls the output node down to the ground voltage using the NMOS transistor ND2 having a relatively large channel size in response to an output signal of the first inverter IND1. The third inverter IND3 pulls the output node up to the external supply voltage VDD using the PMOS transistor PD3 having a relatively large channel size in response to an output signal of the second inverter IND2. This operation enables the first asymmetrical delay unit 410 to decreases a delay time and output the first pull-down delayed signal D_d1d at a high level when the data DATA at a high level is input.

Meanwhile, the second asymmetrical delay unit 420 and the third asymmetrical delay unit 430 receive the second driving control signal DRVBF at a high level.

The NOR gate NOR_D1 of the second asymmetrical delay unit 420 performs a NOR operation on the first pull-down delayed signal D_d1d at a high level and the second driving control signal DRVBF at a high level and outputs an output signal at a low level. The first inverter IND1 of the inverters IND1, IND2, IND3 outputs the external supply voltage VDD in response to an output signal of the NOR gate NOR_D1, the second inverter IND2 outputs the ground voltage in response to an output signal of the first inverter IND1, and the third inverter IND3 outputs the external supply voltage VDD in response to the output signal of the second inverter IND2. This operation enables the second asymmetrical delay unit 420 to decreases the delay time and output the second pull-down delayed signal D_d2d at the high level when the first pull-down delayed signal D_d1d at the high level is input.

Also, the NOR gate NOR_D1 of the third asymmetrical delay unit 430 performs a NOR operation on the second pull-down delayed signal D_d2d at a high level and the second full driving control signal DRVBF at a high level to output an output signal at a low level. In this case, the first inverter IND1 of the inverters IND1, IND2, IND3 outputs the external supply voltage VDD, the second inverter IND2 outputs the ground voltage, and the third inverter IND3 outputs the external supply voltage VDD. This operation enables the third asymmetrical delay unit 430 to decrease the delay time and output the third pull-down delayed signal D_d3d at a high level when the second pull-down delayed signal D_d2d at a high level is input.

The pull-down pre-driver 500 receives the non-delayed data DATA at a high level and the first to third pull-down delayed signals D_d1d, D_d2d, D_d3d at a high level asymmetrically delayed, inverts the data and the first to third pull-down delayed signals D_d1d, D_d2d, D_d3d, and delays the data DATA and the first to third pull-down delayed signals D_d1d to D_d3d by a predetermined time to output pull-down control signals DOKN_Q, DOKN_H, DOKN_F1, DOKN_F2. In this case, the pull-down control signals DOKN_Q, DOKN_H, DOKN_F1, DOKN_F2 are all at low levels.

Accordingly, the NMOS transistors NM1, NM2, NM3, NM4 of the pull-down driver 600 receive the ground voltage and are sequentially turned off according to the sequentially inactivated pull-down control signals DOKN_Q, DOKN_H, DOKN_F1, DOKN_F2.

When the driving ability of the semiconductor device is set to the full driving ability, the mode register 50 loads the mode register set signal MRS as "11", such that the first asymmetrical delay unit 110 of the pull-up slew rate controller 100 receives the first driving control signals DRVH, DRVF at a high level.

The first asymmetrical delay unit 110 receives the data DATA, differently delays the data DATA upon the first and second transitions, and outputs the first pull-up delayed signal D_u1d at a high level, similar to the driving ability being set to the half driving ability.

Also, the second asymmetrical delay unit 120 and the third asymmetrical delay unit 130 receive the first pull-up delayed signal D_u1d and the second pull-up delayed signal D_u2d in response to the first driving control signal DRVF at a high level, differently delay the first pull-up delayed signal D_u1d and the second pull-up delayed signal D_u2d upon the first and second transitions, and output the second and third pull-up delayed signals D_u2d, D_u3d at a high level, respectively.

The pull-up pre-driver 200 receives the non-delayed data DATA at a high level and the first to third pull-up delayed signals D_u1d, D_u2d, D_u3d at a high level asymmetrically delayed, inverts the data DATA and the first to third pull-up delayed signals D_u1d, D_u2d, D_u3d, and delays the data DATA and the first to third pull-up delayed signals D_u1d, D_u2d, D_u3d by a predetermined time to output pull-up control signals DOKP_Q, DOKP_H, DOKP_F1, DOKP_F2. In this case, the pull-up control signals DOKP_Q, DOKP_H, DOKP_F1, DOKP_F2 all move to a low level.

PMOS transistors PM1, PM2, PM3, PM4 receive the external supply voltage VDD and are sequentially turned on in response to the pull-up control signals DOKP_Q, DOKP_H, DOKP_F1, DOKP_F2 sequentially activated at certain delay time intervals. Accordingly, the data output terminal DQ is pulled up to the external supply voltage VDD by the pull-up driver 300 having pull-up driving ability increasing in four steps.

Referring to FIG. 9, the quarter pull-up control signal DOKP_Q is initially at a high level and transitions to a low level at a time point T3 after a predetermined time lapses from a time point T1, and the half pull-up control signal DOKP_H is initially at a high level and transitions to a low level at time point T3-1 later than the time point T3 by a predetermined time. Also, the first full pull-up control signal DOKP_F1 transitions to a low level at a time point T3-2 later than the time point T3-1 by a predetermined time, and the second full pull-up control signal DOKP_F2 transitions to a low level at a time point T3-3 later than the time point T3-2 by a predetermined time. Accordingly, the data output terminal DQ is initially at a low level and transitions to a high level while maintaining the same slew rate value as that when the semiconductor device is half driven, at a time point T4-1.

Also, the quarter pull-down control signal DOKN_Q transitions to a high level at a time point T7 later than the time point T5 by a predetermined time, and the half pull-down control signal DOKN_H transitions to a high level at a time point T7-1 later than the time point T7 by a predetermined time. The first full pull-down control signal DOKN_F1 transitions to a high level at a time point T7-2 later than the time point T7-1 by a predetermined time and the second full pull-down control signal DOKN_F2 transitions to a high level at a time point T7-3 later than the time point T7-2 by a predetermined time. Accordingly, the data output terminal DQ transitions to a low level while maintaining the same slew rate value as that when the semiconductor device is half driven, at a time point T8.

Meanwhile, when the mode register 50 loads the mode register set signal MRS as "11", the first asymmetrical delay unit 410 of the pull-down slew rate controller 400 receives the second driving control signal DRVBH at a low level, and the second and third asymmetrical delay units 420, 430 receive the second driving control signal DRVBF at a low level.

This enables the first to third asymmetrical delay units 410, 420, 430 to minimize the delay time and output the first to third pull-down delayed signals D_d1d, D_d2d, D_d3d at a high level, using the same principle as that when the driving ability is set to the half driving ability.

The pull-down pre-driver 500 receives the non-delayed data DATA at a high level the first to third pull-down delayed signals D_d1d, D_d2d, D_d3d at a high level asymmetrically delayed, inverts the data DATA and the first to third pull-down delayed signals D_d1d, D_d2d, D_d3d, delays the data DATA and the first to third pull-down delayed signals D_d1d, D_d2d, D_d3d by a predetermined time to output pull-down control signals DOKN_Q, DOKN_H, DOKN_F1, DOKN_F2. In this case, the pull-down control signals DOKN_Q, DOKN_H, DOKN_F1, DOKN_F2 are all at a low level.

The NMOS transistors NM1, NM2, NM3, NM4 of the pull-down driver 600 receive the ground voltage and are sequentially turned off in response to the pull-down control signals DOKN_Q, DOKN_H, DOKN_F1, DOKN_F2 at a low level and with different delay times, such that the data output terminal DQ is not pulled down.

Accordingly, the data output terminal DQ is pulled up to the level of the external supply voltage VDD by the pull-up driver 300.

The operation of the semiconductor device according to the second exemplary embodiment of the inventive concept will now be described with reference to FIGS. 1 to 9.

The semiconductor device according to the second exemplary embodiment of the inventive concept employs the pull-up slew rate controller 100 of the exemplary embodiment in FIG. 4 and the pull-down slew rate controller 400 of the exemplary embodiment in FIG. 7.

The semiconductor device according to the second exemplary embodiment differs from that according to the first exemplary embodiment in that the first to third asymmetrical delay units 110, 120, 130 in the pull-up slew rate controller 100 include a reduced number of inverters and an additional NOR gate.

In the first exemplary embodiment of the inventive concept, the inverters INU1, INU2, INU3 of the first to third asymmetrical delay units 110, 120, 130 include transistors PU1, NU2, PU3 or transistors NU1, PU2, NU3 having a different channel size to perform an asymmetrical delay operation according to the level of the data DATA. On the other hand, in the second exemplary embodiment of the inventive concept, the first to third asymmetrical delay units 110, 120, 130 selectively use a path that delays or does not delay the data DATA by a predetermined time using an even number of inverters INV1, . . . INV2N according to the level of the data DATA to perform an asymmetrical delay operation.

When the data DATA at a high level is applied and the driving ability of the semiconductor device is set to the half driving ability, the mode register 50 loads the mode register set signal MRS as "10".

In this case, since the first asymmetrical delay unit 110 receives the first driving control signal DRVH at the high level, the NAND gate ND_U1 of the first asymmetrical delay unit 110 performs a NAND operation on the data DATA at a high level and the first driving control signal DRVH at a high level to output an output signal at a low level.

The even number of inverters INV1, . . . INV2N of the first asymmetrical delay unit 110 receive an output signal of the NAND gate ND_U1 and delay the output signal without inverting the output signal, and the NOR gate NOR_U performs a NOR operation on the non-delayed output signal of the NAND gate ND_U1 and the output signal of the NAND gate ND_U1 delayed without level inversion to output the first pull-up delayed signal D_u1d at a high level.

The NAND gate ND_U1 of the second asymmetrical delay unit 120 performs a NAND operation on the first pull-up delayed signal D_u1d at the high level and the first driving control signal DRVF at the low level to output an output signal at a high level.

In this case, the even number of inverters INV1, . . . INV2N of the second asymmetrical delay unit 120 receive the output signal of the NAND gate ND_U1 and delay the output signal without inverting the level of the output signal, and the NOR gate NOR_U performs a NOR operation on the non-delayed output signal of the NAND gate ND_U1 and the output signal of the NAND gate ND_U1 delayed without level inversion to output the second pull-up delayed signal D_u2d at a low level.

Similarly, the NAND gate ND_U1 of the third asymmetrical delay unit 130 performs a NAND operation on the second pull-up delayed signal D_u2d at a low level and the first driving control signal DRVF at a low level to output an output signal at a high level. In this case, the even number of inverters INV1, . . . INV2N receive the output signal of the NAND gate ND_U1, and delay the output signal without inverting the output signal, and the NOR gate NOR_U performs a NOR operation on the non-delayed output signal of the NAND gate ND_U1 and the output signal of the NAND gate ND_U1 delayed without level inversion to output the third pull-up delayed signal D_u3d at a low level.

The pull-up pre-driver 200 receives the non-delayed data DATA at a high level and the first to third asymmetrically delayed pull-up delayed signals D_u1d, D_u2d, D_u3d, inverts the data and the signals, and delays the data and the signals by a predetermined time to output pull-up control signals DOKP_Q, DOKP_H, DOKP_F1, DOKP_F2, similar to the first exemplary embodiment of the inventive concept. In this case, the pull-up control signals DOKP_Q, DOKP_H, DOKP_F1, DOKP_F2 move to a low level, a low level, a high level and a high level, respectively.

The PMOS transistors PM1, PM2, PM3, PM4 of the pull-up driver 300 receive the external supply voltage VDD, and the PMOS transistors PM1, PM2 are sequentially turned on and the PMOS transistors PM3, PM4 are sequentially turned off in response to the pull-up control signals DOKP_Q, DOKP_H, DOKP_F1, DOKP_F2 having a different delay time. The data output terminal DQ is pulled up to the pull-up driver 300 having pull-up driving ability increasing in two steps.

Referring to FIG. 8, the quarter pull-up control signal DOKP_Q is initially at a high level and transitions to a low level at a time point T3 after a predetermined time lapses from a time point T1, and the half pull-up control signal DOKP_H is initially at a high level and transitions to a low level at a time point T3-1 later than the time point T3 by a predetermined time. Accordingly, the data output terminal DQ is initially at a low level and transitions to a high level with a predetermined slope having a constant slew rate value, at a time point T4. Meanwhile, the quarter pull-down control signal DOKN_Q transitions again to a high level at a time point T7 later than the time point T5 by a predetermined time, and the half pull-down control signal DOKN_H transitions again to a high level at a time point T7-1 later than the time point T7 by a predetermined time. Accordingly, the data output terminal DQ transitions again to a low level with a predetermined slope having a constant slew rate value, at a time point T8.

Meanwhile, when the mode register 50 loads the mode register set signal MRS as "11", the first asymmetrical delay unit 410 of the pull-down slew rate controller 400 receives the second driving control signal DRVBH at a low level, and the second and third asymmetrical delay units 420, 430 receive the second driving control signal DRVBF at a low level.

The first asymmetrical delay unit 410 receives the data DATA at a high level and the second half driving control signal DRVBH at a low level. The first asymmetrical delay unit 410 performs an asymmetrical delay operation using signal delivery through the transistors ND1, PD2, ND3 having a relatively small channel sizes and the transistors PD1, ND2, PD3 having a relatively large channel sizes to output the first pull-down delayed signal D_d1d at a high level, similar to the first exemplary embodiment.

Also, the second asymmetrical delay unit 420 receives the first pull-down delayed signal D_d1d at a high level and the second driving control signal DRVBF at a low level, and performs the asymmetrical delay operation to minimize the delay time and output the second pull-down delayed signal D_d2d at a high level, similar to the first asymmetrical delay unit 410.

Similarly, the third asymmetrical delay unit 430 receives the second pull-down delayed signal D_d2d at a high level and the second full driving control signal DRVBF at a high level, and performs the asymmetrical delay operation to minimize the delay time and output the third pull-down delayed signal D_d3d at a high level, similar to the first asymmetrical delay unit 410.

The pull-down pre-driver 200 receives the non-delayed data DATA at a high level and the first to third pull-down delayed signals D_d1d, d_D2d, D_d3d at a high level asymmetrically delayed, inverts the data DATA and the first to third pull-down delayed signals D_d1d, D_d2d, D_d3d, and delays the data DATA and the first to third pull-down delayed signals D_d1d, D_d2d, D_d3d by a predetermined time to output the pull-down control signals DOKN_Q, DOKN_H, DOKN_F1, DOKN_F2. In this case, the pull-down control signals DOKN_Q, DOKN_H, DOKN_F1, DOKN_F2 are all at a low level, similar to the first exemplary embodiment of the inventive concept.

Also, the NMOS transistors NM1, NM2, NM3, NM4 of the pull-down driver 600 receive a ground voltage and are sequentially turned off according to the pull-down control signals DOKN_Q, DOKN_H, DOKN_F1, DOKN_F2 having a different delay time. Accordingly, the data output terminal DQ is not pulled down by the pull-down driver 600.

If the driving ability of the semiconductor device is set to the full driving ability, the mode register 50 loads the mode register set signal MRS as "11".

In this case, the first asymmetrical delay unit 110 of the pull-up slew rate controller 100 receives the first driving control signal DRVH at a high level.

The first asymmetrical delay unit 110 selectively uses a path that delays or does not delay the data DATA by a predetermined time through the even number of inverters INV1, . . . INV2N according to the level of the data DATA to differently delay the data upon the first and second transitions and output the first pull-up delayed signal D_u1d at a high level.

When the first driving control signal DRVF at a high level is applied to the second asymmetrical delay unit 120 and the third asymmetrical delay unit 130, the second asymmetrical delay unit 120 and the third asymmetrical delay unit 130 differently delay the first pull-up delayed signal D_u1d upon the first and second transitions to output the second and third pull-up delayed signals D_u2d, D_u3d at a high level, similar to the first asymmetrical delay unit 110.

The pull-up pre-driver 200 receives the non-delayed data DATA at a high level and the first to third pull-up delayed signals D_u1d, D_u2d, D_u3d at a high level asymmetrically delayed, inverts the data DATA and the first to third pull-up delayed signals D_u1d, D_u2d, D_u3d, and delays the data DATA and the first to third pull-up delayed signals D_u1d, D_u2d, D_u3d by a predetermined time to output pull-up control signals DOKP_Q, DOKP_H, DOKP_F1, DOKP_F2, similar to the first exemplary embodiment of the inventive concept. In this case, the pull-up control signals DOKP_Q, DOKP_H, DOKP_F1, DOKP_F2 are all at a low level.

Accordingly, the PMOS transistors PM1, PM2, PM3, PM4 of the pull-up driver 300 receive the external supply voltage VDD, and are sequentially turned on according to the pull-up control signals DOKP_Q, DOKP_H, DOKP_F1, DOKP_F2 sequentially activated at certain delay time intervals. Accordingly, the data output terminal DQ is pulled up to the external supply voltage VDD level by the pull-up driver 300 having pull-up driving ability increasing in four steps.

Referring to FIG. 9, the quarter pull-up control signal DOKP_Q is initially at a high level and transitions to a low level at a time point T3 after a predetermined time lapses from time point T1, and the half pull-up control signal DOKP_H is initially at a high level and transitions to a low level at time point T3-1 later than the time point T3 by a predetermined time. Also, the first full pull-up control signal DOKP_F1 transitions to a low level at a time point T3-2 later than the time point T3-1 by a predetermined time, and the second full pull-up control signal DOKP_F2 transitions to a low level at a time point T3-3 later than the time point T3-2 by a predetermined time. Accordingly, the data output terminal DQ is initially at a low level and transitions to a high level while maintaining the same slew rate value as that at the half driving ability, at a time point T4.

Meanwhile, the first asymmetrical delay unit 410 of the pull-down slew rate controller 400 receives the second driving control signal DRVBH at a low level.

Accordingly, the first to third asymmetrical delay units 410, 420, 430 minimize the time delay and output the first to third pull-down delayed signal D_d1d, D_d2d, D_d3d at a high level, similar to the driving ability of the semiconductor device being set to the half driving ability.

The pull-down pre-driver 200 receives the non-delayed data DATA at a high level and the first to third pull-down delayed signals D_d1d, D_d2d, D_d3d at a high level asymmetrically delayed, inverts the data DATA and the first to third pull-down delayed signals D_d1d, D_d2d, D_d3d, and delays the data DATA and the first to third pull-down delayed signals D_d1d, D_d2d, D_d3d by a predetermined time to output the pull-down control signals DOKN_Q, DOKN_H, DOKN_F1, DOKN_F2, similar to the first exemplary embodiment of the inventive concept. In this case, the pull-down control signals DOKN_Q, DOKN_H, DOKN_F1, DOKN_F2 all move to a low level.

Also, the NMOS transistors NM1, NM2, NM3, NM4 of the pull-down driver 600 receive the ground voltage and are sequentially turned off in response to the low level pull-down control signals DOKN_Q, DOKN_H, DOKN_F1, DOKN_F2 having a different delay time. Accordingly, the data output terminal DQ is not pulled down by the pull-down driver 600 but is pulled up to the external supply voltage VDD by the pull-up driver 300.

In such a method, the semiconductor device according to a third exemplary embodiment of the inventive concept can be embodied using the pull-up slew rate controller 100 of the exemplary embodiment in FIG. 3 and the pull-down slew rate controller 400 of the exemplary embodiment in FIG. 7, and the semiconductor device according to a fourth exemplary embodiment of the inventive concept can be embodied using the pull-up slew rate controller 100 of the exemplary embodiment in FIG. 4 and the pull-down slew rate controller 400 of the exemplary embodiment in FIG. 7.

Thus, the driving ability of the driver for pulling output data up or down can be adjusted in the semiconductor device according to an exemplary embodiment of the inventive concept, such that the slew rate can be constant even when the output driving ability of the semiconductor device changes, and signal integrity can be provided and current consumption can be reduced even when the output driving ability is small.

Thus, a semiconductor device of the inventive concept can have a constant slew rate irrespective of a change of the output driving ability, such that signal integrity can be guaranteed irrespective of the output driving ability.

The foregoing is illustrative of exemplary embodiments and is not to be construed as limiting thereof. Although practical exemplary embodiments have been described, those skilled in the art will readily appreciate that many modifications are possible and that the exemplary embodiments, modifications to the exemplary embodiments, as well as other embodiments, are intended to be included within the scope of the appended claims.

What is claimed is:

1. A semiconductor device comprising:
   a pull-up slew rate controller configured to receive a first driving control signal generated in a first mode of operation, a second driving control signal generated in a second mode of operation, and data, and upon a first transition of the data, to sequentially activate the data and a first pull-up delayed signal having different delay times in the first mode of operation and to sequentially activate the data and the first pull-up delayed signal, a second pull-up delayed signal and a third pull-up delayed signal, each having different delay times in the second mode of operation;
   a pull-up driving unit configured to sequentially pull a data output terminal up in response to the data and the first pull-up delayed signal, the second pull-up delayed signal and the third pull-up delayed signal;
   a pull-down slew rate controller configured to, upon a second transition of the data, sequentially activate the data and a first pull-down delayed signal having different delay times in the first mode of operation and to sequentially activate the data and the first pull-down delayed signal, a second pull-down delayed signal and a third pull-down delayed signal, each having different delay times in the second mode of operation; and a pull-down driving unit configured to sequentially pull the data output terminal down in response to the data and the first pull-down delayed signal, the second pull-down delayed signal and the third pull-down delayed signal.

2. The device of claim 1, wherein the pull-up slew rate controller comprises:

a first asymmetrical delay unit configured to delay the data by a greater delay time upon the first transition of the data than upon the second transition to output the first pull-up delayed signal;

a second asymmetrical delay unit configured to delay the first pull-up delayed signal by a greater delay time upon a first transition of the first pull-up delayed signal than upon a second transition thereof to output the second pull-up delayed signal; and a third asymmetrical delay unit configured to delay the second pull-up delayed signal by a greater delay time upon a first transition of the second pull-up delayed signal than upon a second transition thereof to output the third pull-up delayed signal.

3. The device of claim 2, wherein each of the first asymmetrical delay unit, the second asymmetrical delay unit and the third asymmetrical delay unit comprises:

a NAND gate configured to receive one of the data and the first pull-up delayed signal and second pull-up delayed signal, to receive the first driving control signal or the second driving control signal, and perform a NAND operation on the one of the data and the first pull-up delayed signal and the second pull-up delayed signal and the first driving control signal or the second driving control signal; and a plurality of inverters each including pull-up and pull-down devices having different channel sizes and configured to sequentially invert and delay an output signal of the NAND gate, wherein each inverter delays the output signal of the NAND gate through one having a smaller channel size of the pull-up and pull-down devices upon the first transition of the data than upon the second transition.

4. The device of claim 2, wherein each of the first asymmetrical delay unit, the second asymmetrical delay unit and the third asymmetrical delay unit comprises:

a NAND gate configured to receive one of the data and the first pull-up delayed signal and the second pull-up delayed signal, receive the first driving control signal or the second driving control signal, and perform a NAND operation on the one of the data and the first pull-up delayed signal and the second pull-up delayed signal and the first driving control signal or the second driving control signal;

an inverter group including an even number of inverters and configured to delay an output signal of the NAND gate by a predetermined time; and a NOR gate configured to perform a NOR operation on the output signal of the NAND gate and an output signal of the inverter group to output the first pull-up delayed signal, the second pull-up delayed signal and the third pull-up delayed signal.

5. The device of claim 1, wherein the pull-down slew rate controller comprises:

a first asymmetrical delay unit configured to delay the data by a greater delay time upon the second transition of the data than upon the first transition to output the first pull-down delayed signal;

a second asymmetrical delay unit configured to delay the first pull-down delayed signal by a greater delay time upon a second transition of the first pull-down delayed signal than upon a first transition thereof to output the second pull-down delayed signal; and a third asymmetrical delay unit configured to delay the second pull-down delayed signal by a greater delay time upon a second transition of the second pull-down delayed signal than upon a first transition thereof to output the third delay pull-down data.

6. The device of claim 5, wherein each of the first asymmetrical delay unit, the second asymmetrical delay unit and the third asymmetrical delay unit comprises:

a NOR gate configured to receive one of the data and the first pull-down delayed signal and the second pull-down delayed signal, to receive a first driving control signal or second inverted driving control signal, and perform a NOR operation on the one of the data and the first pull-down delayed signal and the second pull-down delayed signal and the first inverted driving control signal or second inverted driving control signal; and a plurality of inverters each including pull-up and pull-down devices having different line widths and configured to sequentially invert and delay an output signal of the NOR gate, wherein each inverter delays the output signal of the NOR gate through one having a smaller line width of the pull-up and pull-down devices upon the first transition of the data than upon the second transition.

7. The device of claim 5, wherein each of the first asymmetrical delay unit, the second asymmetrical delay unit and the third asymmetrical delay unit comprises:

a NOR gate configured to receive one of the data and the first pull-up delayed signal and the second pull-up delayed signal, to receive the first driving control signal or the second driving control signal, and to perform a NOR operation on the one of the data and the first pull-up delayed signal and the second pull-up delayed signal and the first driving control signal or the second driving control signal;

an inverter group comprising an even number of inverters and configured to delay an output signal of the NOR gate by a predetermined time; and a NAND gate configured to receive the output signal of the NOR gate and an output signal of the inverter group and configured to perform a NAND operation on the output signal of the NOR gate and the output signal of the inverter group to output the first pull-down delayed signal, the second pull-down delayed signal, and the third pull-down delayed signal.

8. The device of claim 1, wherein the pull-up driving unit comprises:

a pull-up pre-driver configured to invert the data and the first pull-up delayed signal, the second pull-up delayed signal and the third pull-up delayed signal to output a plurality of pull-up control signals; and a pull-up driver including a first pull-up device, a second pull-up device, a third pull-up device and a fourth pull-up device for pulling the data output terminal up in response to the respective pull-up control signals, and wherein the first pull-up device and the second pull-up device are sequentially turned on in response to the first pull-up control signal and the second pull-up control signal in the first mode of operation, and the first pull-up device, the second pull-up device, the third pull-up device and the fourth pull-up device are sequentially turned on in response to the first pull-up control signal, the second pull-up control signal, the third pull-up control signal, and the fourth pull-up control signal in the second mode of operation.

9. The device of claim 1, wherein the pull-down driving unit comprises:
   a pull-down pre-driver configured to invert the data and the first pull-down delayed signal, the second pull-down delayed signal and the third pull-down delayed signal to output a plurality of pull-down control signals; and
   a pull-down driver including a first pull-down device, a second pull-down device and a fourth pull-down device for pulling the data output terminal down in response to the respective pull-down control signals, and
   wherein the first pull-down device and the second pull-down device are sequentially turned on in response to the first pull-down control signal and the second pull-down control signal in the first mode of operation, and the first pull-down device, the second pull-down device, the third pull-down device to fourth pull-down device are sequentially turned on in response to the first pull-down control signal, the second pull-down control signal, the third pull-down control signal and the fourth pull-down control signal in the second mode of operation.

10. A pull-up pull-down driving apparatus comprising:
    a pull-up driver comprising a first pull-up transistor, a second pull-up transistor, a third pull-up transistor and a fourth pull-up transistor coupled in parallel to a data output terminal for pulling the data output terminal up in response to respective pull-up control signals, the first pull-up transistor and the second pull-up transistor being sequentially turned on in response to a first pull-up control signal and a second pull-up control signal in a half driving operation, and the first pull-up transistor, the second pull-up transistor, the third pull-up transistor and the fourth pull-up transistor being sequentially turned on in response to the first pull-up control signal, the second pull-up control signal a third pull-up control signal and a fourth pull-ups control signal in a full driving operation,
    a pull-down driver comprising a first pull-down transistor, a second pull-down transistor, a third pull-down transistor and a fourth pull-down transistor for pulling the data output terminal down in response to respective pull-down control signals, the first pull-down transistor and the second pull-down transistor being sequentially turned on in response to a first pull-down control signal and a second pull-down control signal in the half driving operation, and the first pull-down transistor, the second pull-down transistor, the third pull-down transistor and fourth pull-down transistor being sequentially turned on in response to the first pull-down control signal, the second pull-down control signal, a third pull-down control signal and a fourth pull-down control signal in the full driving operation, and
    a pull-up pre-driver coupled to the pull-up driver and configured to invert data being provided to the data output terminal and a first pull-up delayed signal, a second pull-up delayed signal and a third pull-up delayed signal to output the respective first pull-up control signal, the second pull-up control signal, the third pull up control signal and the fourth pull-up control signal.

11. A pull-up pull-down driving apparatus comprising:
    a pull-up driver comprising a first pull-up transistor, a second pull-up transistor, a third pull-up transistor and a fourth pull-up transistor coupled in parallel to a data output terminal for pulling the data output terminal up in response to respective pull-up control signals, the first pull-up transistor and the second pull-up transistor being sequentially turned on in response to a first pull-up control signal and a second pull-up control signal in a half driving operation, and the first pull-up transistor, the second pull-up transistor, the third pull-up transistor and the fourth pull-up transistor being sequentially turned on in response to the first pull-up control signal, the second pull-up control signal, a third pull-up control signal, and a fourth pull-up control signal in a full driving operation,
    a pull-down driver comprising a first pull-down transistor, a second pull-down transistor, a third pull-down transistor and a fourth pull-down transistor for pulling the data output terminal down in response to respective pull-down control signals, the first pull-down transistor and the second pull-down transistor being sequentially turned on in response to a first pull-down control signal and a second pull-down control signal in the half driving operation, and the first pull-down transistor, the second pull-down transistor, the third pull-down transistor and fourth pull-down transistor being sequentially turned on in response to the first pull-down control signal, the second pull-down control signal, a third pull-down control signal and a fourth pull-down control signal in the full driving operation, and
    a pull-down pre-driver coupled to the pull-down driver and configured to invert a data being provided to the data output terminal and a first pull-down delayed signal, a second pull-down delayed signal and a third pull-down delayed signal to output the respective first pull-down control signal, the second pull-down control signal, the third pull-down control signal and the fourth pull-down control signal.

* * * * *